US008164955B2

(12) United States Patent
Park

(10) Patent No.: US 8,164,955 B2
(45) Date of Patent: Apr. 24, 2012

(54) NOR FLASH MEMORY DEVICE AND METHOD FOR FABRICATING THE SAME

(75) Inventor: Sung Kun Park, Cheongju-Si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 781 days.

(21) Appl. No.: 12/189,955

(22) Filed: Aug. 12, 2008

(65) Prior Publication Data

US 2009/0046515 A1    Feb. 19, 2009

(30) Foreign Application Priority Data

Aug. 14, 2007  (KR) .................. 10-2007-0081597

(51) Int. Cl.
*G11C 11/34*  (2006.01)

(52) U.S. Cl. .................. 365/185.17; 257/315; 257/324; 365/185.28

(58) Field of Classification Search .................. 257/315, 257/324; 365/185.17, 185.28
See application file for complete search history.

(56) References Cited

U.S. PATENT DOCUMENTS

| | | | | |
|---|---|---|---|---|
| 5,661,060 | A | * | 8/1997 | Gill et al. .................. 438/257 |
| 5,717,636 | A | * | 2/1998 | Dallabora et al. ....... 365/185.13 |
| 6,133,604 | A | * | 10/2000 | Chi .................. 257/315 |
| 6,242,307 | B1 | | 6/2001 | Sheu |
| 6,674,138 | B1 | * | 1/2004 | Halliyal et al. ............... 257/411 |
| 6,897,514 | B2 | * | 5/2005 | Kouznetsov et al. ......... 257/314 |
| 6,903,405 | B2 | | 6/2005 | Takahashi |
| 2004/0232444 | A1 | | 11/2004 | Shimizu |

FOREIGN PATENT DOCUMENTS

| | | |
|---|---|---|
| DE | 19616603 A1 | 10/1996 |
| EP | 0657928 A1 | 6/1995 |
| JP | 07-221210 A | 8/1995 |
| JP | 2003-282741 A | 10/2003 |
| KR | 10-2002-0057341 | 7/2002 |

OTHER PUBLICATIONS

Kazerounian et al., "Alternate Metal Virtual Ground EPROM Array Implemented in a 0.8um Process for Very High Density Applications," Electron Device Meeting, 1991. IEDM '91. Technical Digest., International. pp. 311-314.*
Inoue et al., "NAND Flash Applicatoins Design Guide," Apr. 2003, System Solutions from Toshiba America Electronics Components, Inc. pp. 1-29.*
Office Action dated Oct. 4, 2011 in Japanese Application No. 2008-208465, filed Aug. 13, 2008.

* cited by examiner

*Primary Examiner* — Alexander Sofocleous
(74) *Attorney, Agent, or Firm* — Saliwanchik, Lloyd & Eisenschenk

(57) ABSTRACT

Embodiments of a NOR flash memory and method for fabricating the same are provided. Bit lines can be formed as self-aligned source and drain regions between adjacent first polysilicon patterns. Contacts for the source and drain regions can be provided according to bit line instead of per cell. Word lines can be formed as second polysilicon patterns, which are used as control gates, and are provided perpendicular to the longitudinal axis of the bit lines. During formation of the second polysilicon patterns, a dielectric film and exposed regions of the first polysilicon patterns can be etched to form floating gates below the second polysilicon patterns.

6 Claims, 8 Drawing Sheets

NOR FLASH MEMORY DEVICE AND METHOD FOR FABRICATING THE SAME

CROSS-REFERENCE TO RELATED APPLICATION

The present application claims the benefit under 35 U.S.C. §119 of Korean Patent Application No. 10-2007-0081597, filed Aug. 14, 2007, which is hereby incorporated by reference in its entirety.

BACKGROUND

Non-volatile memory has the advantage that stored data is not lost even when a power supply is interrupted. As a result, it is often used for storing data in systems, such as a personal computer (PC) basic input/output system (BIOS), a set top box, a printer, and a network server. Recently, non-volatile memory is being used in digital cameras and cellular phones.

One common non-volatile memory is an electrically erasable programmable read-only memory (EEPROM) type flash memory device capable of electrically erasing data in a memory cell in a lump manner or according to sector unit. During a programming operation for such a flash memory device, channel hot electrons from in a drain region to accumulate the electrons in a floating gate, thereby increasing the threshold voltage of a cell transistor.

During an erase operation, the flash memory device generates a high voltage between a source, substrate, and the floating gate to discharge electrons accumulated in the floating gate, thereby lowering the threshold voltage of the cell transistor.

With the rapid progress of high integration, the reduction of the cell size is needed. However, since it is difficult to secure a margin in a process, a further reduction is difficult to accomplish.

BRIEF SUMMARY

Embodiments of the present invention provide a NOR flash memory device and method for fabricating the same.

A NOR flash memory device according to an embodiment can include a gate formed on a semiconductor substrate, the gate configured having first polysilicon patterns aligned in a row, a dielectric film on the first polysilicon patterns, and a second polysilicon pattern on the dielectric film and aligned over the first polysilicon patterns. A plurality of electrodes can be provided in the semiconductor substrate in a column form between adjacent first polysilicon patterns. Each electrode column can be provided with contacts at an end portion.

A method for fabricating a NOR flash memory device according to an embodiment can comprise: forming a tunnel oxide film on a semiconductor substrate; forming first polysilicon patterns on the tunnel oxide film; forming electrode lines on the semiconductor substrate between adjacent first polysilicon patterns by performing an ion implantation process on the semiconductor substrate using the first polysilicon patterns as a mask; forming a dielectric film and second polysilicon patterns on the semiconductor substrate on which the tunnel oxide film and the first polysilicon pattern are formed; and forming contacts at an end of each electrode line.

DETAILED DESCRIPTION

Figure 1:
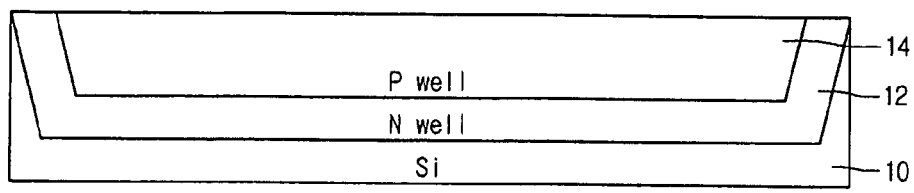
FIGS. 1 to 6 are cross-sectional views of a NOR flash memory device according to an embodiment.

Hereinafter, embodiments of a NOR flash memory device and a method for fabricating the same will be described with reference to the accompanying drawings.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

In the drawings, the thickness and size of each layer may be exaggerated or schematically shown or omitted for convenience and clarity for explanation. Also, the size of each component is not necessarily to scale.

A NOR flash memory device can provide an external address bus for read operations, allowing random-access capabilities. In addition, cells are connected in parallel to the bit lines, which allows cells to be read and programmed individually. Erasing and writing operations of a NOR flash memory device proceeds on a sector-by-sector basis.

Figure 6:
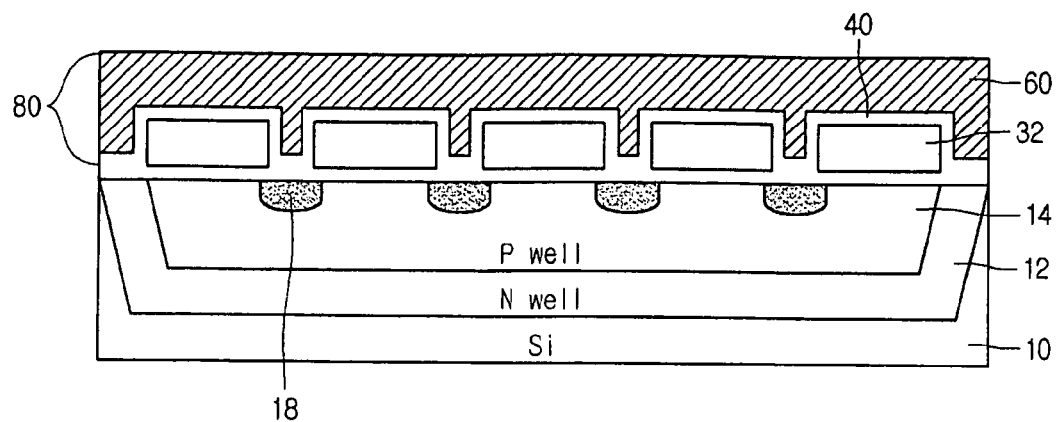
Figure 7:
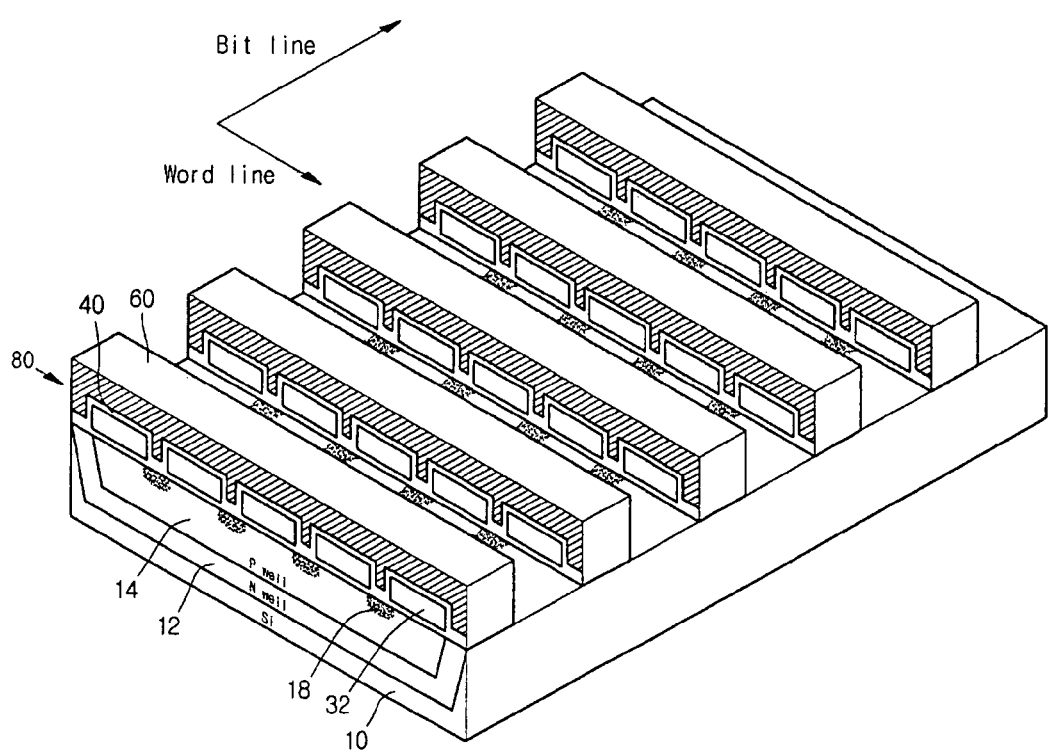
FIG. 7 is a perspective view of a NOR flash memory device according to an embodiment.

FIG. 6 is a cross-sectional view of a NOR flash memory device according to an embodiment and FIG. 7 is a perspective view of a NOR flash memory device according to an embodiment.

Referring to FIGS. 6 and 7, a NOR flash memory device according to an embodiment includes a gate 80 formed on a semiconductor substrate 10 and configured of first polysilicon patterns 32, a dielectric film 40, and a second polysilicon pattern 60; a plurality of electrodes 18 in a line form in the semiconductor substrate 10 between adjacent first polysilicon patterns 32; and contacts (see reference 70 of FIG. 8) formed on each electrode 18 line.

Figure 5A:
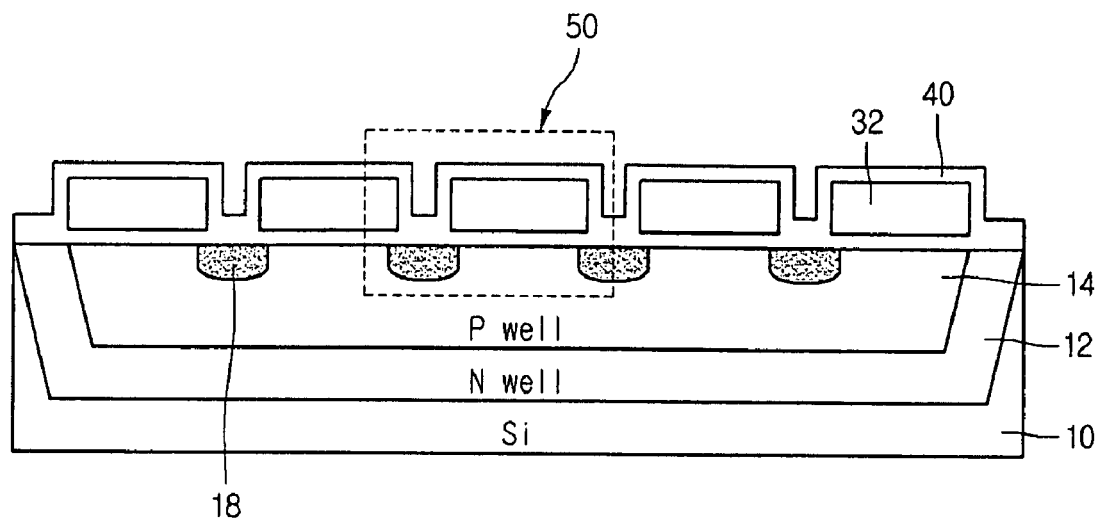
Figure 5B:
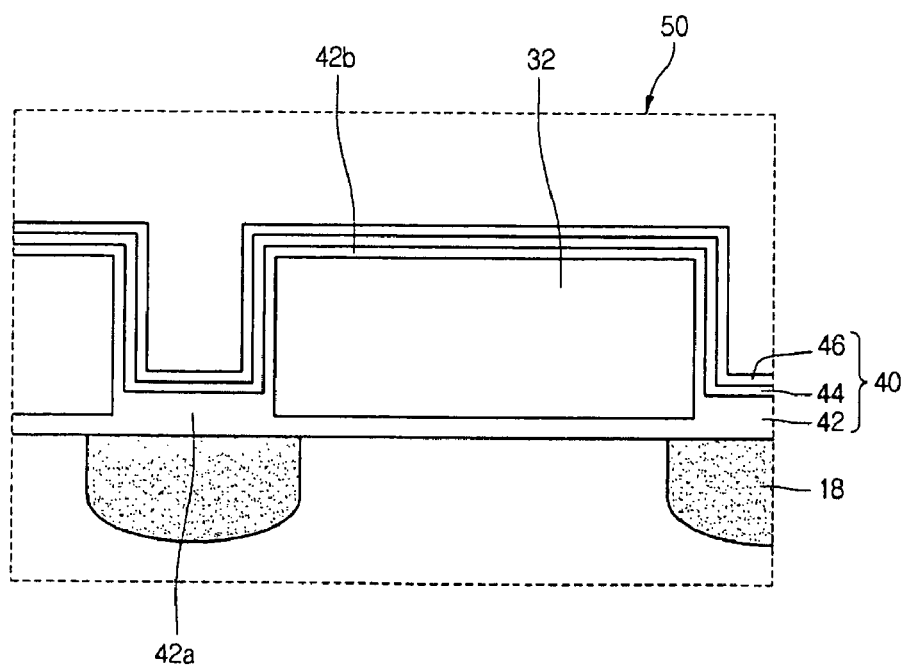

As shown in FIG. 5b, the dielectric film 40 can be formed of an oxide-nitride-oxide (ONO) film configured of a stack of a first oxide film 42, a nitride film 44, and a second oxide film 46. The first oxide film 42 can be provided such that a region of the first oxide film 42 contacting the electrodes 18 of the semiconductor substrate 10 is thicker than a region of the first oxide film 42 contacting the first polysilicon patterns 32.

According to embodiments, the electrodes 18 can be provided in an intersecting pattern with the second polysilicon pattern 60. For example, the second polysilicon patterns 60 can be formed perpendicular to the longitudinal axis of the electrode lines 18.

A method of fabricating a NOR flash memory device will be described with reference to FIGS. 1-7.

First, referring to FIG. 1, an N-well 12 and a P-well 14 can be formed in a semiconductor substrate 10. Although not shown, the semiconductor substrate 10 may include epitaxial layers.

The N-well can be formed by implanting ions, such as arsenic (As) or phosphorous (P), at high concentration into the substrate 10, and the P-well can be formed by implanting ions, such as boron (B), at low concentration into the substrate 10.

Figure 2:
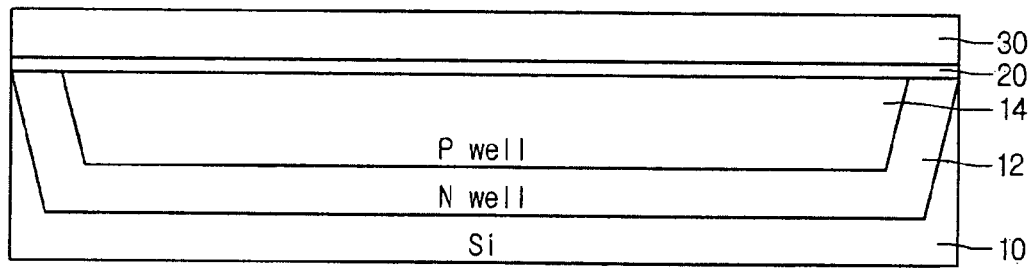

Referring to FIG. 2, a tunnel oxide film 20 and a first polysilicon film 30 can be formed on the semiconductor substrate 10.

The tunnel oxide film 20 is utilized when programming (hot carrier injection) and erasing (Fouler Nordheim tunneling (FN tunneling)). Therefore, in certain embodiments, a high quality oxide film can be formed by a wet oxidation process.

Figure 3:
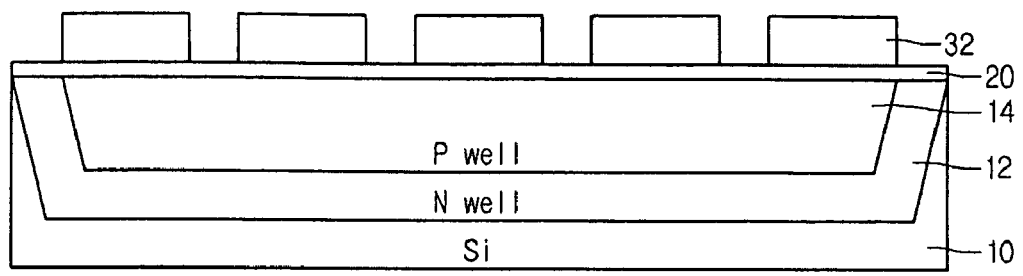

Referring to FIG. 3, the first polysilicon film 30 can be patterned to form lines of first polysilicon patterns 32 separated from each other by a predetermined interval.

The first polysilicon pattern 32 can be used as a floating gate.

At this time, a coupling ratio can be increased by minimizing the interval between the first polysilicon patterns 32.

In the conventional flash memory device contacts are formed between floating gates so that a design margin is needed for forming the contact between the floating gates.

However, according to embodiments of the present invention, since the electrodes for source/drain regions are formed in the semiconductor substrate, it is possible to reduce the conventional contact margin.

Therefore, a high integration of the flash memory device can be realized by minimizing the interval between the first polysilicon patterns 32.

Figure 4:
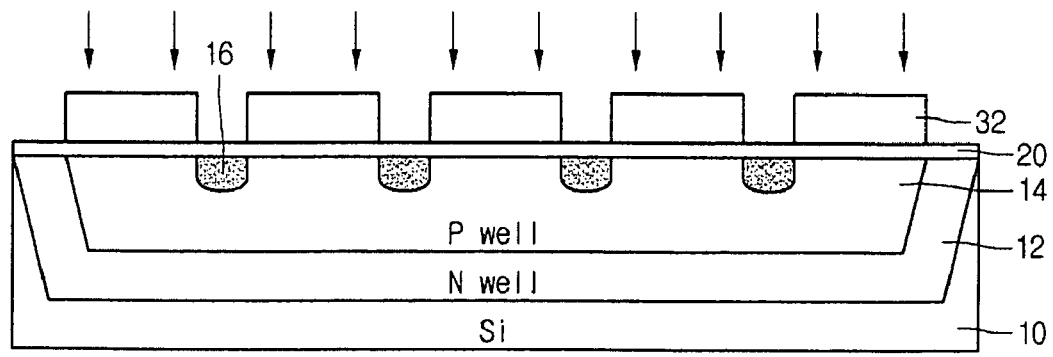

As shown in FIG. 4, an ion implantation process can be performed over the semiconductor substrate 10 on which the first polysilicon pattern 32 is formed to form ion implantation layer patterns 16.

In one embodiment, the ion implantation process can be performed by implanting arsenic (As) ions at a dose of $1 \times 10^{15} \sim 5 \times 10^{15}$ atoms/cm$^2$ and an energy of about 20~40 KeV using the first polysilicon patterns 32 as the mask.

Since the ion implantation ion is performed using the lines of the first polysilicon patterns 32 as the mask, the ion implantation patterns 16 are formed by a self-align method without requiring a further mask.

The ion implantation layer patterns 16 are activated by a heat treatment process so that they can be used as the electrodes (see reference 18 of FIG. 5a).

Referring to FIGS. 5a and 5b, a dielectric film 40 can be formed on the semiconductor substrate 10 including the first polysilicon patterns 32.

The dielectric film 40 can be formed of an oxide-nitride-oxide (ONO) where the first oxide film 42, the nitride film 44, and the second oxide film 46 are sequentially formed.

The dielectric film 40 performs a role of isolating the upper and lower polysilicon patterns.

The first oxide film 42 can be formed, for example, by a thermal oxidation process. The nitride film 44 can be formed, for example, by a low pressure chemical vapor deposition (LP-CVD) process. The second oxide film 42 can be formed, for example, by a high temperature oxide (HTO) through a chemical vapor deposition (CVD) process.

In the thermal oxidation process for forming the first oxide film 42, a diffusion phenomenon of the ion implantation patterns 16 can be activated to from the electrodes 18.

Accordingly, the electrodes 18 can be formed by a self-align method using the first polysilicon patterns 32. Therefore, conformance of an overlay with the first polysilicon pattern 32 being the floating gate is not required.

Furthermore, after forming the ion implantation layer patterns 16, the ion implantation layer 16 can be activated by the thermal oxidation process for forming the first oxide film 42 without requiring a separate thermal process for activation.

Also, referring to FIG. 5b, when performing the thermal oxidation process for forming the first oxide film 42, the speed of the thermal oxidation occurs faster at the region where the ion implantation layer patterns 16 are formed so that the region 42a contacting the electrodes 18 of the semiconductor substrate 10 is formed to be thicker than the region 42b contacting the first polysilicon patterns 32.

Because the region 42a contacting the electrodes 18 of the semiconductor substrate 10 is formed to be thicker than the region 42b contacting the first polysilicon patterns 32, damage to the substrate where the electrodes 18 are formed can be inhibited during the etching process for forming the control gate (described later). Therefore, it is possible to inhibit an increase of resistance in the electrodes 18 caused by etching damage.

In a specific embodiment, the first oxide film 42 of the region 42b contacting the first polysilicon pattern 32 can be formed to a thickness of about 100 Å and the first oxide film 42 of the region contacting the electrode 18 of the semiconductor substrate 10 can be formed to a thickness of about 250~300 Å.

Referring to FIG. 6, the second polysilicon pattern 60 can be formed on the semiconductor substrate 10 on which the first polysilicon pattern 32 and the dielectric 40 are formed. The first polysilicon pattern 32, the dielectric film 40, and the second polysilicon pattern 60 provide a gate 80.

According to an embodiment, a second polysilicon film can be formed on the substrate 10. Then, a pattern mask for forming the second polysilicon patterns 60 can be provided through, for example, a photolithography process. The second polysilicon film can be etched to form the second polysilicon patterns 60. In further embodiments, the exposed dielectric 40 and the exposed regions of the first polysilicon patterns 32 can be removed.

In the etching process, because the first oxide film 42 of the region 42a contacting the electrode 18 of the semiconductor substrate 10 is thickly formed, damage to the electrodes 18 can be inhibited.

The second polysilicon pattern 60 can be used as a control gate to excite charges in the first polysilicon patterns 32 formed below so that the second polysilicon pattern 60 performs a role of applying bias voltage for charging and discharging.

Referring to FIG. 7, the control gate (the second polysilicon pattern 60) can be used as a word line (WL) and the electrode 18 can be used as a bit line (BL).

In a further embodiment, a spacer (not shown) can be formed on a side wall of the gate 80 and an interlayer isolating film (not shown) can be formed on the semiconductor substrate 10 on which the gate 80 and the spacer are formed. A contact (see reference 70 of FIG. 8) connected to each electrode 18 can be formed through the interlayer isolating film.

At this time, one contact can be formed for each electrode 18 used as the bit lines.

FIGS. 8 to 11 are views for explaining the operation of the NOR flash memory device according to an embodiment.

Figure 8:
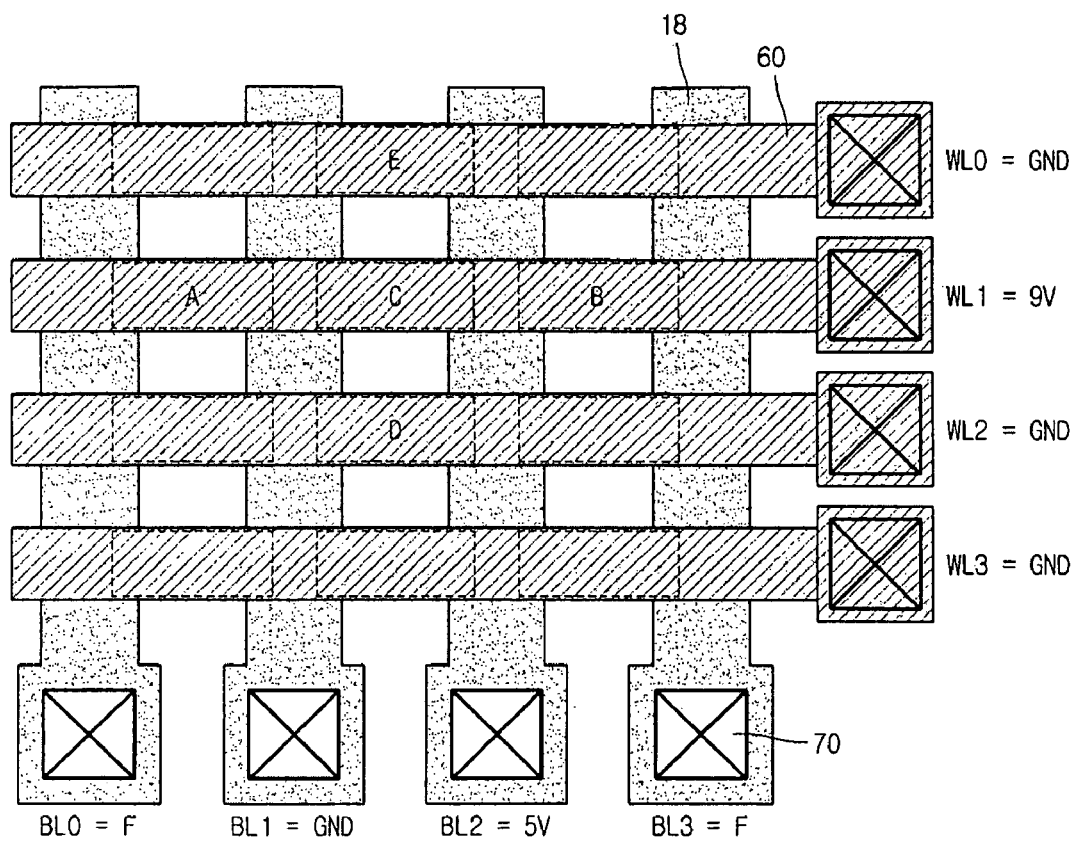
FIGS. 8 to 11 are views for explaining operations of a NOR flash memory device according to an embodiment.
Figure 9:
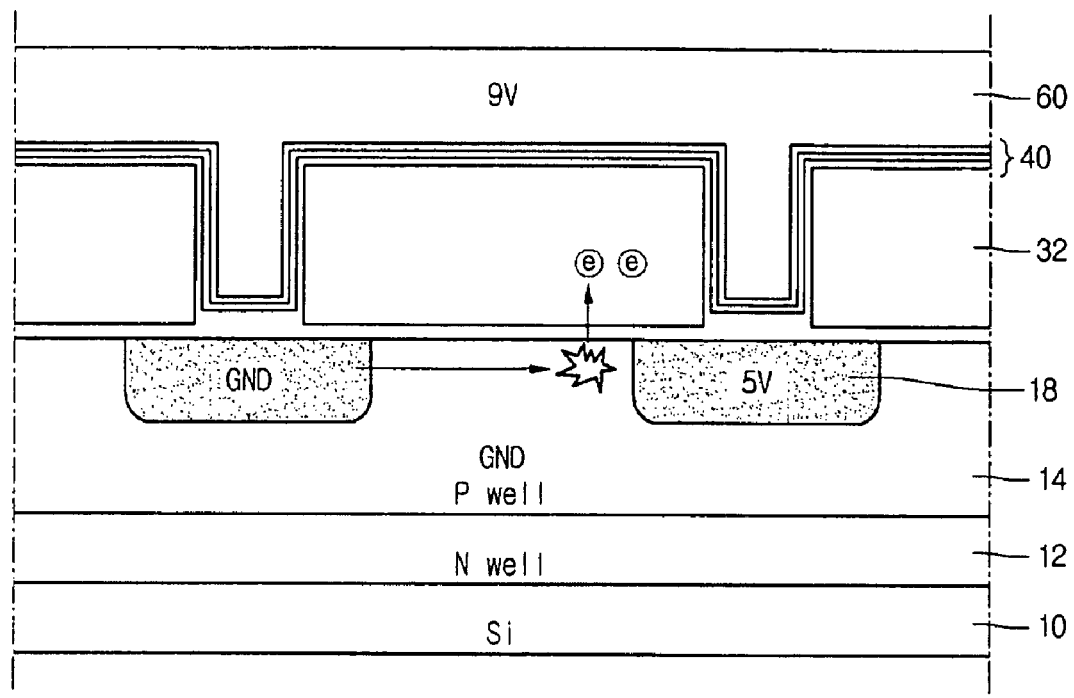

FIG. 8 is a schematic plan view of the NOR flash memory device arranged according to an embodiment and FIG. 9 is a view for explaining a programming operation.

As shown in FIG. 8, the NOR flash memory device is formed so that the electrode 18 and the second polysilicon pattern 60 used as the control gate are aligned in intersecting lines.

A contact 70 can be formed on each electrode 18 at an end region of an electrode line 18 on an outer side of the second polysilicon pattern lines 60.

The control gate (second polysilicon pattern 60) can be used as the word line (WL) and the electrode 18 can be used as the bit line (BL).

In the NOR flash memory device according to an embodiment, to program the C region, the BL0 and BL3 electrodes are floated, the BL1 electrode is grounded, and the BL2 electrode is applied with 5V.

The WL0, WL2, and WL3 electrodes of the control gates (second polysilicon patterns 60) are grounded, the WL1 electrode is applied with 9V, and the P-well region 14 of the semiconductor substrate 10 is grounded.

As shown in FIG. 9, which shows a cross-section including the C region, the ground and 5V is applied to the channel of the C region (using BL1 and BL2) to generate the hot carriers and at the same time 9V is applied to the WL1 electrode, so that the hot carriers from the channel of the C region are injected to the floating gate (first polysilicon pattern 32) for programming.

At this time, no programming occurs in the A region even with the voltage of 9V applied to the WL1 electrode and the ground applied to the channel of the A region from BL1 because BL0 is floating.

In addition, no programming occurs in the B region even with the voltage of 5V applied to the channel of the B region and the 9V applied to the WL1 electrode because BL3 is floating.

The ground and the 5V is applied to the channel of the D region and the E region, generating the hot carriers, but the WL0 and the WL2 electrodes are grounded so that the program operation is not performed for those regions.

Figure 10:
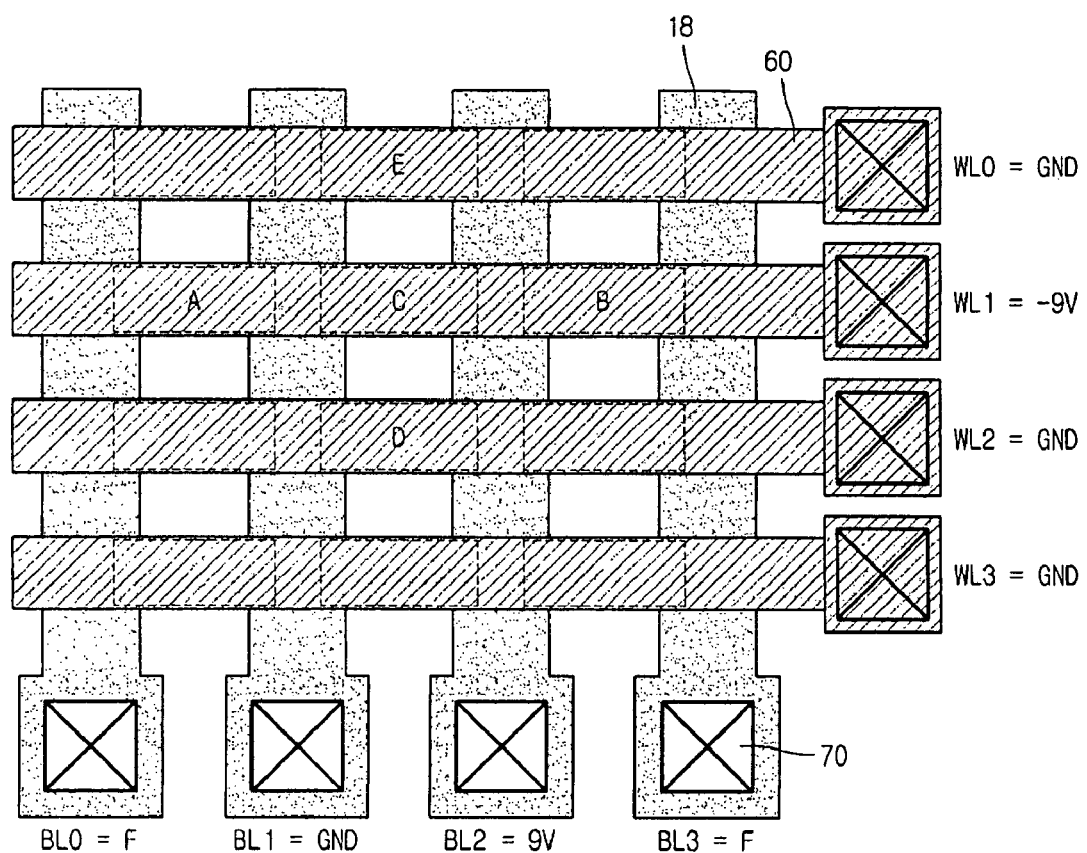
Figure 11:
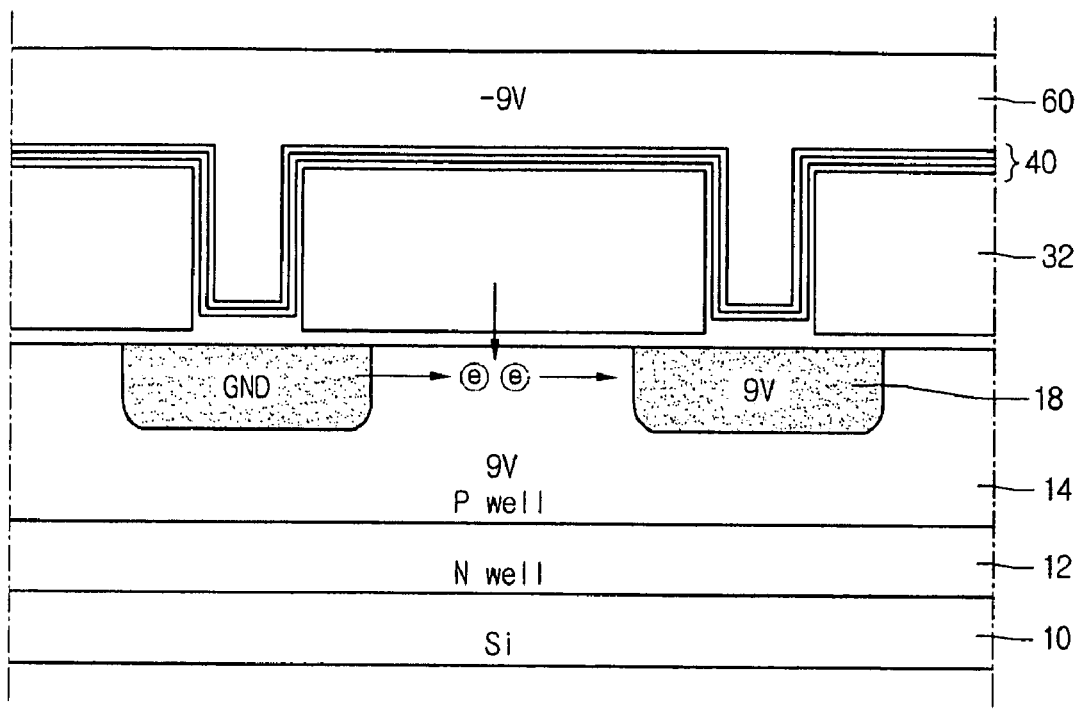

FIG. 10 is a schematic plan view of the NOR flash memory device arranged according to an embodiment and FIG. 11 is a view for explaining an erase operation.

In the NOR flash memory device according to an embodiment, in order to erase the programmed C region, the BL0 and BL3 electrodes are floated, the BL1 electrode is grounded, and the BL2 electrode is applied with 9V.

The WL0, WL2, and WL3 electrodes of the control gates are grounded, the WL1 electrode is applied with −9V, and the P-well region 14 of the semiconductor substrate 10 is applied with 9V.

As shown in FIG. 11, the ground and 9V are applied to the channel of the C channel and at the same time −9V is applied to the WL1 electrode and 9V is applied to the P-well region 14 of the semiconductor substrate 10 to discharge electrons that were injected to the floating gate during the programming operation. The discharging occurs through F-N tunneling.

Table 1 shows applied voltage for operations of the NOR flash memory device according to a specific embodiment.

|  | Read | Program | Erase |
| --- | --- | --- | --- |
| Control gate | 3.3~4.5 V | 9 V | −9 V |
| Source | Ground | Ground | Ground or 9 V |
| Drain | 1 V | 5 V | Ground or 9 V |
| Substrate(P-well) | Ground | Ground | 9 V |

The electrode 18 can be a source or a drain according to the operating cell. Therefore, the source and drain distinctions provided in the table represents the particular bit line being the electrode 18 for a cell.

As described above, because the electrode being the bit line is self-aligned using the floating gate, the alignment of the floating gate and the active area should conform.

Also, since the electrodes are formed by implanting ions using the floating gate as the mask, a separate mask is not needed. In addition, by forming an initial oxide film for an ONO film using a thermal oxidation process, a separate heat treatment process after the ion implantation is also not required.

Further, by providing contacts according to bit lines instead of per cell, the process margin can be increased and the integration of the cell is increased, making it possible to implement compactness of the memory device.

By utilizing the NOR type structure, high speed operation can be implemented, and by provided the reduced number of contacts as with a NAND type flash memory, it is possible to have advantage of both the NOR type and the NAND type flash memories.

According to embodiments, the oxide film of the ONO film contacting the electrode regions is formed thicker than the portions of the oxide film contacting the other regions so that the electrode is protected when performing a subsequent etching process during forming the control gates. Therefore, it is possible to inhibit the increase in the resistance of the bit line due to etching damage.

According to an embodiment, each cell is separated by the electrodes without requiring the forming of shallow trench isolation between cells, making it possible to reduce the size of the cell and increase the integration of the memory device.

Any reference in this specification to "one embodiment," "an embodiment," "example embodiment," "specific embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A NOR flash memory device comprising:
   a gate on a semiconductor substrate, the gate comprising:
      first polysilicon patterns spaced apart by a predetermined interval, and providing floating gates,
      a dielectric film on the first polysilicon patterns, and
      a second polysilicon pattern aligned over the first polysilicon patterns and on the dielectric film, and providing a control gate for the floating gates;
   a plurality of electrodes in a line form, each electrode provided in the semiconductor substrate at the interval between adjacent first polysilicon patterns; and
   contacts for the plurality of electrodes, the contacts provided at an end region on each electrode;
   wherein the dielectric film comprises an oxide-nitride-oxide (ONO) film configured of a stack of a first oxide film, a nitride film, and a second oxide film,
   wherein a portion of the first oxide film contacting the plurality of electrodes is thicker than a portion of the first oxide film contacting the first polysilicon patterns, wherein the portion of the first oxide film contacting the plurality of electrodes has a thickness of about 250~300 Å.

2. The NOR flash memory device according to claim 1, wherein the second polysilicon pattern forms a word line.

3. The NOR flash memory device according to claim 1, wherein each of the plurality of electrodes forms a bit line.

4. The NOR flash memory device according to claim 1, wherein the plurality of electrodes are formed in an intersecting pattern with the second polysilicon pattern such that each electrode extends in a direction perpendicular to the longitudinal axis of the second polysilicon pattern.

5. The NOR flash memory device according to claim 1, wherein the plurality of electrodes are self aligned between the adjacent first polysilicon patterns.

6. The NOR flash memory device according to claim 1, wherein the plurality of electrodes are formed by implantation of ions into regions of the semiconductor substrate.

* * * * *